(12) United States Patent
Tanabe

(10) Patent No.: US 11,367,702 B2
(45) Date of Patent: Jun. 21, 2022

(54) BONDER

(71) Applicant: TAZMO CO., LTD., Okayama (JP)

(72) Inventor: Masaaki Tanabe, Okayama (JP)

(73) Assignee: TAZMO CO., LTD., Okayama (JP)

( * ) Notice: Subject to any disclaimer, the term of this patent is extended or adjusted under 35 U.S.C. 154(b) by 518 days.

(21) Appl. No.: 16/463,844

(22) PCT Filed: Nov. 14, 2017

(86) PCT No.: PCT/JP2017/040883
§ 371 (c)(1),
(2) Date: May 23, 2019

(87) PCT Pub. No.: WO2018/101024
PCT Pub. Date: Jun. 7, 2018

(65) Prior Publication Data
US 2019/0393185 A1 Dec. 26, 2019

(30) Foreign Application Priority Data
Nov. 30, 2016 (JP) .............................. JP2016-232353

(51) Int. Cl.
*H01L 23/00* (2006.01)
*H01L 21/683* (2006.01)
(52) U.S. Cl.
CPC .......... *H01L 24/75* (2013.01); *H01L 21/6835* (2013.01); *H01L 2224/75102* (2013.01);
(Continued)
(58) Field of Classification Search
CPC ... H01L 21/02; H01L 21/67092; H01L 21/68; H01L 21/6835; H01L 21/6838; H01L 2224/75102; H01L 2224/75301
See application file for complete search history.

(56) References Cited

U.S. PATENT DOCUMENTS 7,550,052 B2 * 6/2009 Fournel ............... H01L 21/6835
156/160
2006/0141742 A1 6/2006 Fournel et al.
(Continued)

FOREIGN PATENT DOCUMENTS

JP 2003-165051 A 6/2003
JP 2006-051556 A 2/2006
(Continued)

OTHER PUBLICATIONS

International Search Report for corresponding App. No. PCT/JP2017/040883, dated Jan. 9, 2018.
(Continued)

*Primary Examiner* — Minh N Trinh
(74) *Attorney, Agent, or Firm* — Renner, Otto, Boisselle & Sklar, LLP

(57) ABSTRACT

A bonder includes a first chuck unit 1A, a second chuck unit 1B, a first base 21A, a second base 21B, and a first floating mechanism 3A. The first chuck unit 1A and the second chuck unit 1B are chuck units in a pair including respective suction surfaces for suction of bonding targets and are arranged while respective suction surfaces 11a and 11b face each other. The first base 21A and the second base 21B support the first chuck unit 1A and the second chuck unit 1B respectively. The first floating mechanism 3A applies gas pressure to a back surface 12a of the first chuck unit 1A to float the first chuck unit 1A from the first base 21A, thereby moving the suction surface 11a of the first chuck unit 1A toward the suction surface 11b of the second chuck unit 1B.

6 Claims, 14 Drawing Sheets

(52) U.S. Cl.
CPC ............ *H01L 2224/75301* (2013.01); *H01L 2224/75824* (2013.01); *H01L 2224/75842* (2013.01)

(56) References Cited

U.S. PATENT DOCUMENTS

| | | |
|---|---|---|
| 2011/0214809 A1 | 9/2011 | Sugiyama et al. |
| 2013/0133836 A1 | 5/2013 | Yasumoto |
| 2014/0311653 A1 | 10/2014 | Nakamura et al. |
| 2014/0318711 A1 | 10/2014 | Wada et al. |
| 2019/0333798 A1* | 10/2019 | Tanabe .............. H01L 21/67259 |
| 2019/0393185 A1* | 12/2019 | Tanabe .................... H01L 21/68 |

FOREIGN PATENT DOCUMENTS

| | | |
|---|---|---|
| JP | 2009-265266 A | 11/2009 |
| JP | 2013-187393 A | 9/2013 |
| JP | 2015-146339 A | 8/2015 |

OTHER PUBLICATIONS

Extended European Search Report for corresponding European Application No. 17875533.6 dated Jun. 5, 2020.

* cited by examiner

BONDER

TECHNICAL FIELD

An embodiment of the present invention relates to a technique of bonding for targets such as wafers.

BACKGROUND ART

In many existing bonders, chuck units in a pair are arranged one above the other, and suction surfaces for suction of bonding targets are arranged to face each other. Conventionally, two bonding targets between the suction surfaces have been caught under pressure and bonded to each other by moving one of the chuck units directly using a driving mechanism such as an actuator (including a ball screw, etc.) (see patent literature 1, for example).

CITATION LIST

Patent Literature

Patent literature 1: Japanese published unexamined patent application No. 2009-265266

SUMMARY OF INVENTION

Technical Problem

The conventional bonder has difficulty in applying pressure uniformly to the bonding targets when the bonding targets are caught under pressure. This is caused by the failure to apply pressure uniformly to the chuck unit and resultant deformation such as distortion occurring at the suction surface of the chuck unit.

Thus, at least one embodiment of the present invention is intended to provide a bonder capable of maintaining a high degree of smoothness on a suction surface of a chuck unit.

Solution to Problem

A bonder according to one embodiment of the present invention includes a first chuck unit, a second chuck unit, a first base, a second base, and a first floating mechanism. The first chuck unit and the second chuck unit are chuck units in a pair including respective suction surfaces for suction of bonding targets and are arranged with the respective suction surfaces facing each other. The first base and the second base support the first chuck unit and the second chuck unit respectively. The first floating mechanism applies gas pressure to the back surface of the first chuck unit to float the first chuck unit from the first base, thereby moving the suction surface of the first chuck unit toward the suction surface of the second chuck unit.

According to the foregoing bonder, as the gas pressure is applied to the back surface of the first chuck unit, uniform application of pressure to this back surface is encouraged. This makes it unlikely that the first chuck unit will be subjected to deformation such as distortion. Thus, even when the bonding targets are caught under pressure with the first chuck unit and the second chuck unit at the time of bonding, deformation is unlikely to occur at least at the suction surface of the first chuck unit.

Advantageous Effects of Invention

According to at least one embodiment of the present invention, a high degree of smoothness can be maintained on a suction surface of a chuck unit.

DESCRIPTION OF EMBODIMENTS

[1] First Embodiment

[1-1] Configuration of Bonder

Figure 1:
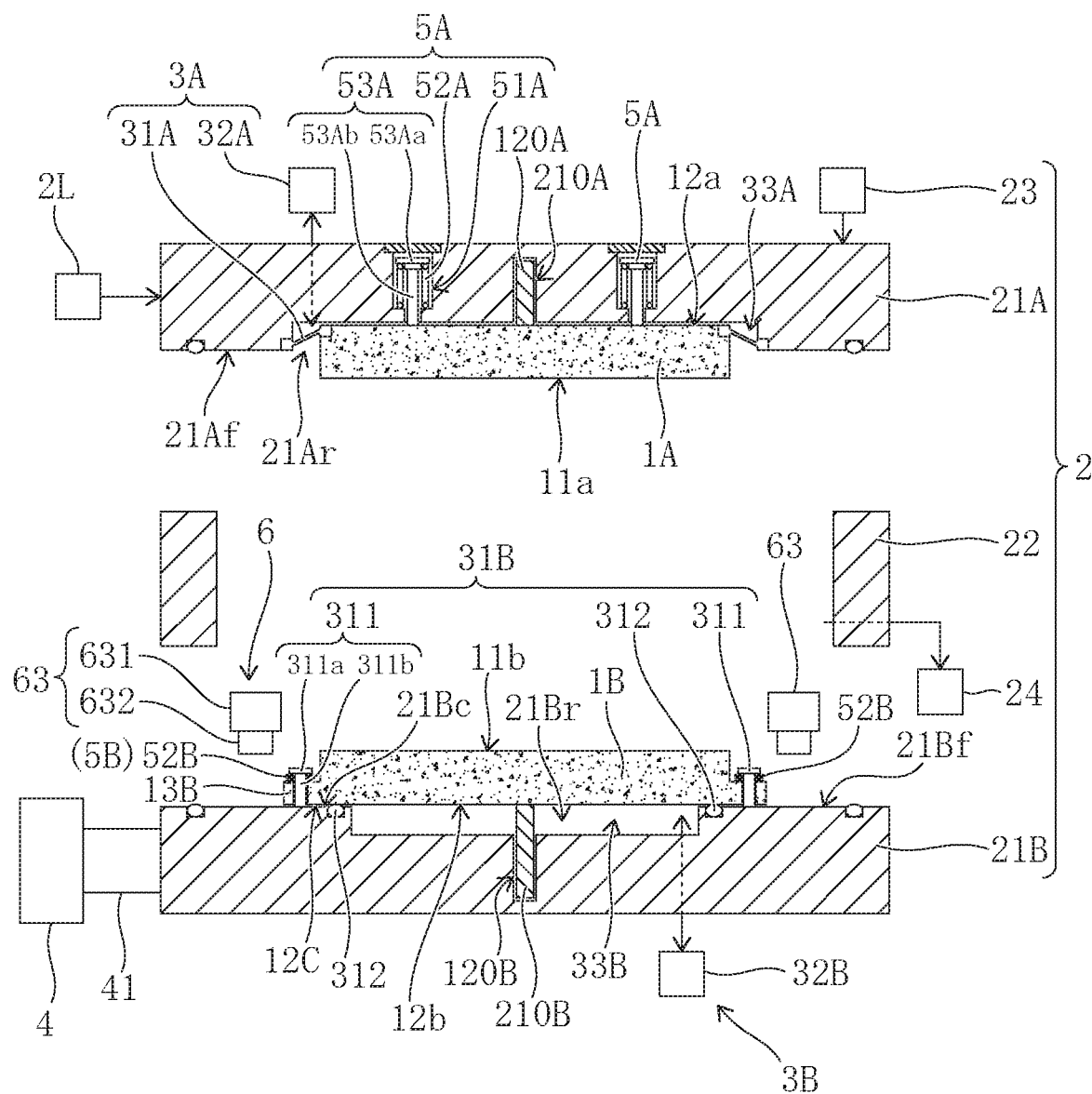
FIG. 1 is a conceptual view showing the configuration of a bonder according to a first embodiment.

FIG. 1 is a conceptual view showing the configuration of a bonder according to a first embodiment. As shown in FIG. 1, the bonder includes a first chuck unit 1A, a second chuck unit 1B, a chamber mechanism 2, a locking mechanism 2L, a first floating mechanism 3A, a second floating mechanism 3B, a rotary mechanism 4, a first biasing mechanism 5A, a second biasing mechanism 5B, and an alignment mechanism 6.

<Chuck Unit>

The first chuck unit 1A and the second chuck unit 1B include a suction surface 11a and a suction surface 11b respectively for suction of bonding targets, and are arranged with the respective suction surfaces 11a and 11b facing each other. The first chuck unit 1A is provided with a through hole (not shown in the drawings) formed at a predetermined position (for example, a center position) of the suction surface 11a. The suction surface 11a is provided with a slit (not shown in the drawings) extending throughout the suction surface 11a and leading to the through hole. With a bonding target placed on the suction surface 11a, vacuum suction is applied through the through hole. By doing so, gas pressure in the slit can be reduced and the bonding target can be sucked on the suction surface 11a. In this way, the bonding target can be chucked on the first chuck unit 1A. The second chuck unit 1B is also provided with a through hole and a slit (not shown in the drawings) similar to those of the first chuck unit 1A to allow the second chuck unit 1B to chuck the bonding target. Each of the first chuck unit 1A and the second chuck unit 1B is preferably formed from ceramic having a low thermal expansion coefficient and high heat conductivity.

In the first embodiment, the first chuck unit 1A and the second chuck unit 1B are arranged one above the other in the vertical direction in such a manner that the respective suction surfaces 11a and 11b extend horizontally. At the time of suction of the bonding target on the suction surface 11a (at the time of chuck of the bonding target on the first chuck unit 1A), the first chuck unit 1A is arranged below the second chuck unit 1B so as to point the suction surface 11a upwardly. Meanwhile, at the time of suction of the bonding target on the suction surface 11b (at the time of chuck of the bonding target on the second chuck unit 1B), the second chuck unit 1B is arranged below the first chuck unit 1A so as to point the suction surface 11b upwardly. The upper and lower positions of the first chuck unit 1A and the second chuck unit 1B are switched using the rotary mechanism 4 described later.

<Chamber Mechanism>

The chamber mechanism 2 includes a first base 21A, a second base 21B, a side wall 22, a driving part 23, and an exhaust part 24. The first base 21A is arranged adjacent to a back surface 12a (a surface opposite the suction surface 11a) of the first chuck unit 1A and supports the first chuck unit 1A. The second base 21B is arranged adjacent to a back surface 12b (a surface opposite the suction surface 11b) of the second chuck unit 1B and supports the second chuck unit 1B.

More specifically, the first base 21A supports the first chuck unit 1A through the first floating mechanism 3A described later. To prevent the center position of the first chuck unit 1A from deviating from a predetermined position while the first chuck unit 1A is floated, a shaft 120A projects from the back surface 12a of the first chuck unit 1A and is slidably inserted into a recessed receiver 210A formed at the first base 21A.

The second base 21B supports the second chuck unit 1B through the second floating mechanism 3B described later. To prevent the center position of the second chuck unit 1B from deviating from a predetermined position while the second chuck unit 1B is floated, a shaft 120B projects from the back surface 12b of the second chuck unit 1B and is slidably inserted into a recessed receiver 210B formed at the second base 21B.

Preferably, play (gap) for permitting slight tilt of the suction surface 11a of the first chuck unit 1A is provided between the shaft 120A and the receiver 210A. Likewise, play (gap) for permitting slight tilt of the suction surface 11b of the second chuck unit 1B is preferably provided between the shaft 120B and the receiver 210B. By doing so, even if the suction surface 11a is tilted slightly from the suction surface 11b before bonding, this tilt is absorbed by the foregoing play at the time of the bonding. As a result, the suction surfaces 11a and 11b are placed in positions parallel to each other. This eliminates the need for always maintaining the suction surfaces 11a and 11b in parallel positions to simplify manufacture of the bonder.

The first base 21A is allowed to move in a direction perpendicular to the suction surface 11a (or 11b) (in the first embodiment, this direction corresponds to the vertical direction and will be called a "vertical direction" unless otherwise specified). This move is realized by the driving part 23. This allows the first base 21A to move relative to the second base 21B in the vertical direction. A lifting and lowering unit using an air cylinder, for example, is employed as the driving part 23. In the first embodiment, the first base 21A is configured to be movable in the vertical direction relative to the second base 21B. Instead of the first base 21A, the second base 21B may be configured to be movable in the vertical direction relative to the first base 21A. Alternatively, both the first base 21A and the second base 21B may be configured to be movable in the vertical direction.

The chamber mechanism 2 makes the first base 21A and the second base 21B get closer to each other, thereby allowing formation of a chamber 2a (see FIG. 5B) between the bases. The chamber 2a houses the first chuck unit 1A and the second chuck unit 1B inside the chamber 2a and is enclosed. More specifically, making the first base 21A and the second base 21B get closer to each other forms enclosed space surrounded by the first base 21A, the second base 21B, and the side wall 22, and this space becomes the chamber 2a. The side wall 22 may be integrated with the first base 21A or the second base 21B. Alternatively, the side wall 22 may be separated from these bases and may be caught between these bases when the first base 21A and the second base 21B get closer to each other.

In the chamber mechanism 2, to prevent the first base 21A, the second base 21B, and the side wall 22 from deviating from their positions relative to each other (positions allowing formation of the enclosed chamber 2a) in the course of formation of the chamber 2a (namely, during their moves in the vertical direction), the first base 21A, the second base 21B, and the side wall 22 are preferably guided by a guide member to define their move paths in the vertical direction.

The exhaust part 24 can reduce gas pressure in the chamber 2a until the interior of the chamber 2a is placed in a vacuum. A gas pressure regulation device such as a vacuum pump is used as the exhaust part 24, for example.

<Locking Mechanism>

The locking mechanism 2L is a mechanism capable of maintaining the positions of the first base 21A and the second base 21B relative to each other at the time of bonding. More specifically, to prevent the chamber 2a from being opened by the moves of the first base 21A and the second base 21B to be farther from each other caused by gas pressures applied to the respective back surfaces 12a and 12b of the first chuck unit 1A and the second chuck unit 1B at the time of bonding, the locking mechanism 2L fixes the positions of the first base 21A and the second base 21B relative to each other.

<Floating Mechanism>

(First Floating Mechanism)

The first floating mechanism 3A is a mechanism that floats the first chuck unit 1A from the first base 21A by applying the gas pressure to the back surface 12a of the first chuck unit 1A. By the flotation of the first chuck unit 1A, the suction surface 11a of the first chuck unit 1A is moved toward the suction surface 11b of the second chuck unit 1B.

More specifically, the first floating mechanism 3A includes a support 31A and a first gas pressure regulator 32A. The support 31A supports the first chuck unit 1A so as to allow flotation of the first chuck unit 1A from the first base 21A, and forms enclosed space 33A between the first base 21A and the first chuck unit 1A.

In the first embodiment, the first base 21A includes a facing surface 21Af facing the back surface 12a of the first chuck unit 1A. The facing surface 21Af includes a recess 21Ar allowing entry of an end portion of the first chuck unit 1A (an end portion including the back surface 12a) in the vertical direction. The opening edge of the recess 21Ar and the outer edge of the back surface 12a of the first chuck unit 1A are connected with a diaphragm as the support 31A. In this way, space enclosed with the diaphragm is formed as the enclosed space 33A between the bottom surface of the recess 21Ar and the back surface 12a of the first chuck unit 1A.

The first gas pressure regulator 32A can change the state of the interior of the enclosed space 33A from a vacuum state to a pressurized state by changing gas pressure in the enclosed space 33A. By reducing the gas pressure in the enclosed space 33A to be lower than the gas pressure in the chamber 2a (internal pressure) to generate a gas pressure difference, the first chuck unit 1A is given holding power of attracting the first chuck unit 1A toward the first base 21A. Meanwhile, increasing the gas pressure in the enclosed space 33A (internal pressure) allows the first chuck unit 1A to be floated from the first base 21A. At this time, the diaphragm is deformed by following the flotation of the first chuck unit 1A, so that the enclosed state in the enclosed space 33A is maintained without being broken.

(Second Floating Mechanism)

The second floating mechanism 3B is a mechanism that floats the second chuck unit 1B from the second base 21B by applying the gas pressure to the back surface 12b of the second chuck unit 1B. By the flotation of the second chuck unit 1B, the suction surface 11b of the second chuck unit 1B is moved toward the suction surface 11a of the first chuck unit 1A. Compared to a distance of move of the first chuck unit 1A, a distance of move of the second chuck unit 1B can be relatively small. Thus, the second floating mechanism 3B can be a mechanism that floats the second chuck unit 1B slightly from the second base 21B.

More specifically, the second floating mechanism 3B includes a support 31B and a second gas pressure regulator 32B. The support 31B supports the second chuck unit 1B so as to allow flotation of the second chuck unit 1B from the second base 21B, and forms enclosed space 33B between the second base 21B and the second chuck unit 1B. In the first embodiment, the support 31B is configured using a plurality of pins 311 and a sealing member 312 described below. As an example, an O-ring is used as the sealing member 312. The second floating mechanism 3B may further include a disc spring 52B of the second biasing mechanism 5B described later as a part of the configuration of the second floating mechanism 3B.

In the first embodiment, the second chuck unit 1B has a peripheral side surface where a flange 13B is formed to extend on the same plane as the back surface 12b. The pins 311 that limit the direction of move of the flange 13B to the vertical direction penetrate the flange 13B. More specifically, the second base 21B includes a facing surface 21Bf facing the back surface 12b of the second chuck unit 1B. Each of the pins 311 includes a head 311a and a shaft 311b. With the shaft 311b penetrating the flange 13B, a tip portion of the shaft 311b is fixed to the facing surface 21Bf of the second base 21B. In this way, the second chuck unit 1B is to move in a limited range between the facing surface 21Bf and the head 311a of the pin 311. Still more specifically, the range of move of the second chuck unit 1B is limited to a range between the disc spring 52B arranged between the head 311a of each pin 311 and the flange 13B of the second chuck unit 1B, and the facing surface 21Bf. The flange 13B does not always extend on the same plane as the back surface 12b but can be formed on the peripheral side surface of the second chuck unit 1B and at a different height from the back surface 12b.

The second base 21B includes a recess 21Br formed inside an annular region 21Bc facing a peripheral region 12c of the back surface 12b of the second chuck unit 1B. The elastically deformable sealing member 312 is interposed between the peripheral region 12c and the annular region 21Bc. In this way, space enclosed with the sealing member 312 is formed as the enclosed space 33B between the bottom surface of the recess 21Br and the back surface 12b of the second chuck unit 1B. As long as the enclosed space 33B can be formed between the back surface 12b of the second chuck unit 1B and the second base 21B using the sealing member 312, the recess 21Br is not absolute necessity.

The second gas pressure regulator 32B can change the state of the interior of the enclosed space 33B from a vacuum state to a pressurized state by changing gas pressure in the enclosed space 33B. By reducing the gas pressure in the enclosed space 33B to be lower than the gas pressure in the chamber 2a (internal pressure) to generate a gas pressure difference, the second chuck unit 1B is given holding power of attracting the second chuck unit 1B toward the second base 21B. Meanwhile, increasing the gas pressure in the enclosed space 33B (internal pressure) allows the second chuck unit 1B to be floated from the second base 21B. To prevent break of the enclosed state in the enclosed space 33B occurring at this time, the sealing member 312 is preferably a member that deforms elastically (stretches) by following the flotation of the second chuck unit 1B.

<Rotary Mechanism>

The rotary mechanism 4 is a mechanism including a rotary axis 41 extending in a direction along the suction surface 11a of the first chuck unit 1A (or the suction surface 11b of the second chuck unit 1B), and capable of switching the positions of the first base 21A and the second base 21B by turning over the chamber mechanism 2 around the rotary axis 41.

In the first embodiment, the rotary axis 41 is arranged horizontally and connected to a side surface of the second base 21B. By rotating the rotary axis 41 and turning over the chamber mechanism 2, the upper and lower positions of the first base 21A and the second base 21B are switched. As long as the rotary axis 41 can be used for turning over the chamber mechanism 2, the rotary axis 41 can be connected to a different position (a side surface of the first base 21A, for example) not limited to the second base 21B.

<Biasing Mechanism>

(First Biasing Mechanism)

The first biasing mechanism 5A biases the first chuck unit 1A toward the first base 21A in the vertical direction. In the first embodiment, the first biasing mechanism 5A includes a plurality of first biasing mechanism 5A. Each of the first biasing mechanism 5A is composed of a housing chamber 51A, a compression spring 52A, and a pin 53A. The housing chamber 51A is formed at the first base 21A. The compression spring 52A is housed in the housing chamber 51A so as to be elastically deformable in the vertical direction.

The pin 53A includes a head 53Aa and a shaft 53Ab, and is arranged so as to place the head 53Aa and the shaft 53Ab in the following states. The head 53Aa is located in the housing chamber 51A while abutting on one end of the compression spring 52A (an end opposite the first chuck unit 1A). The shaft 53Ab extends toward the first chuck unit 1A in the vertical direction while being passed through the compression spring 52A. Further, the shaft 53Ab penetrates the first base 21A so as to limit a direction of move of the pin 53A to the vertical direction. The tip of the shaft 53Ab is connected to the back surface 12a of the first chuck unit 1A.

According to the first biasing mechanism 5A, the head 53Aa of the pin 53A is biased toward the opposite side of the first chuck unit 1A with the compression spring 52A. As a result, the first chuck unit 1A is biased toward the first base 21A in the vertical direction through the pin 53A. As will be described later, at the time of bonding, the first chuck unit 1A is arranged above the second chuck unit 1B in the vertical direction. In this state, the gas pressure in the chamber 2a is reduced. Hence, while upward holding power has acted on the first chuck unit 1A as a result of the gas pressure difference between the gas pressure in the enclosed space 33A and the gas pressure in the chamber 2a, this holding power is reduced by the reduction in this gas pressure difference. Even if the holding power is reduced in this way, the first biasing mechanism 5A applies biasing force to the first chuck unit 1A with which downward move of the first chuck unit 1A under its own weight can be prevented. This makes it possible to attract the first chuck unit 1A toward the first base 21A.

(Second Biasing Mechanism)

The second biasing mechanism 5B biases the second chuck unit 1B toward the second base 21B in the vertical direction. In the first embodiment, the second biasing mechanism 5B is composed of the disc spring 52B arranged between the head 311a of each pin 311 and the flange 13B of the second chuck unit 1B. The disc spring 52B is arranged with the shaft 311b penetrating the disc spring 52B.

According to the second biasing mechanism 5B, the second chuck unit 1B is biased toward the second base 21B by the disc spring 52B. As will be described later, at the time of chuck of a bonding target, the second chuck unit 1B is arranged above the first chuck unit 1A in the vertical direction in some cases. Even in such cases, the second biasing mechanism 5B applies biasing force to the second chuck unit 1B with which downward move of the second chuck unit 1B under its own weight can be prevented. This makes it possible to attract the second chuck unit 1B toward the second base 21B.

<Alignment Mechanism>

Figure 2A:
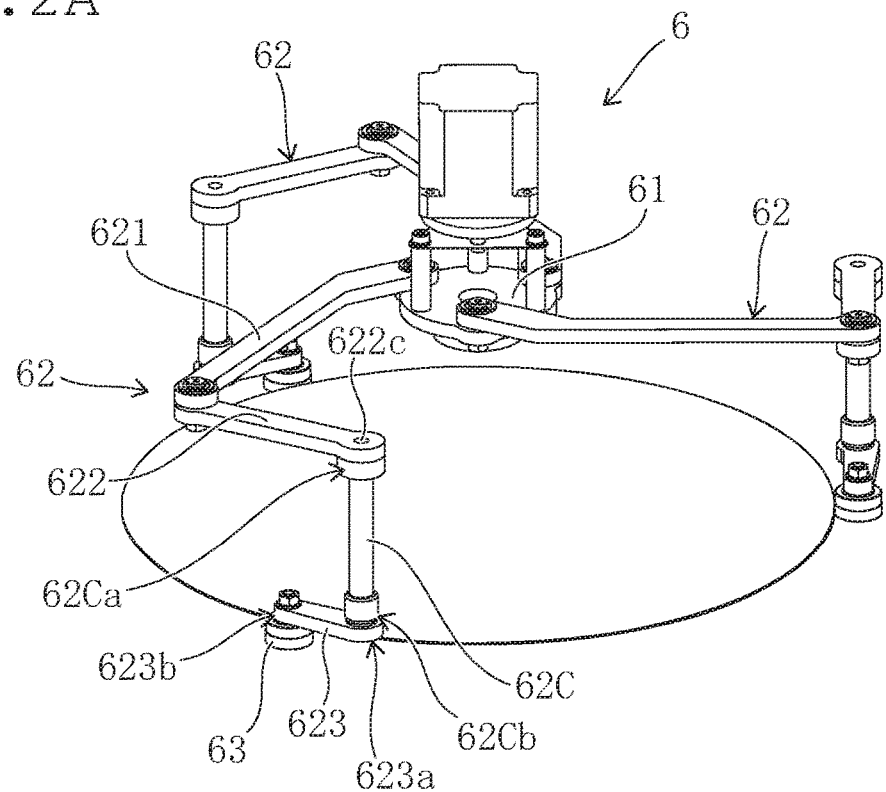
FIG. 2A is a perspective view showing an alignment mechanism of the bonder.
Figure 2B:
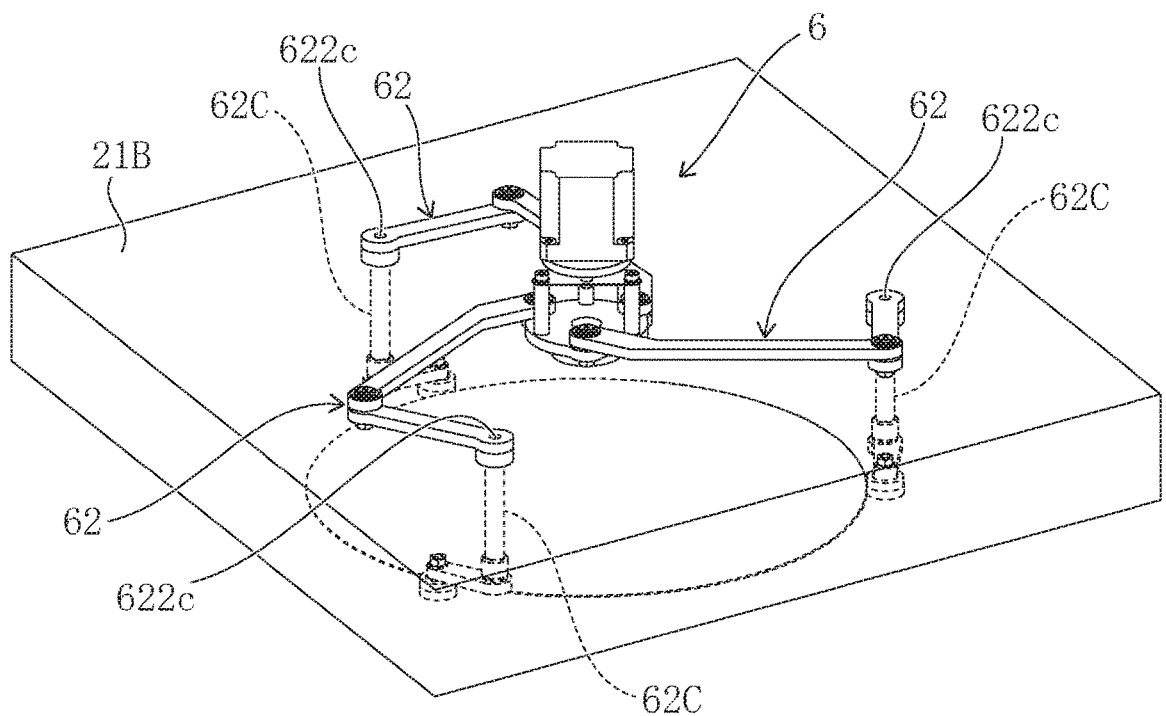
FIG. 2B is a perspective view showing a state of attachment of the alignment mechanism.
Figure 3A:
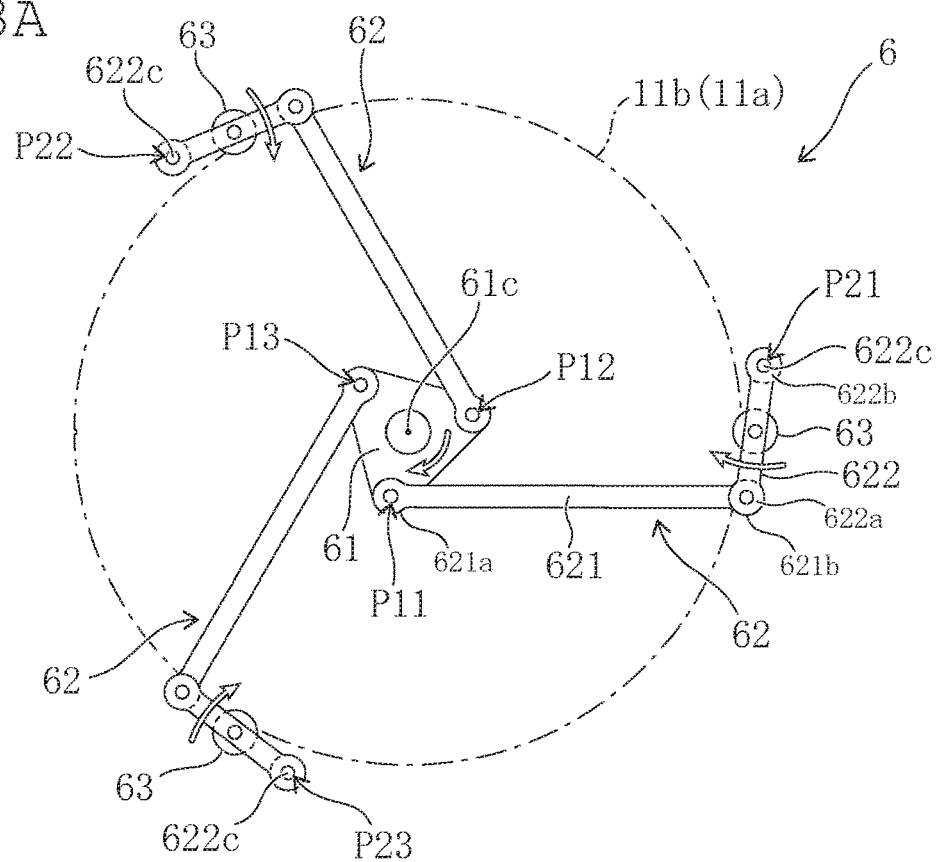
FIGS. 3A and 3B are plan views showing the motions of the alignment mechanism.
Figure 3B:
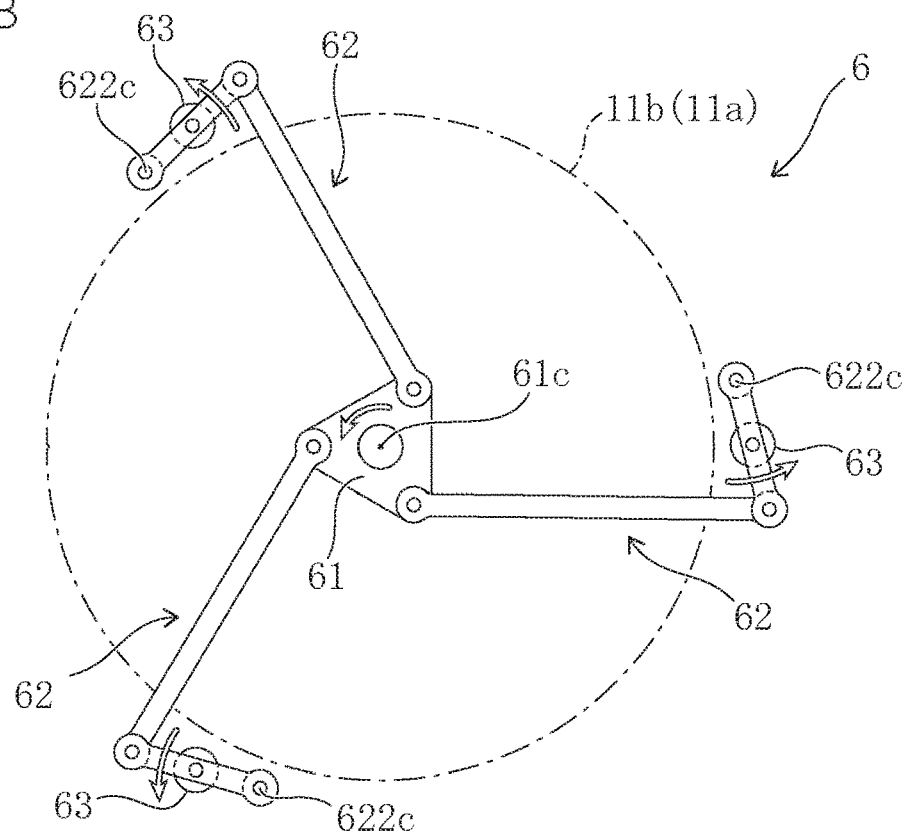

FIG. 2A is a perspective view showing the alignment mechanism 6. FIG. 2B is a perspective view showing a state of attachment of the alignment mechanism 6 to the chamber mechanism 2. FIGS. 3A and 3B are plan views showing the motions of the alignment mechanism 6. The alignment mechanism 6 is used for adjusting the positions of bonding targets when these bonding targets are to be chucked on corresponding ones of the first chuck unit 1A and the second chuck unit 1B. More specifically, the alignment mechanism 6 includes a rotary unit 61 with a first rotary axis 61c, three power transmission mechanisms 62, and three alignment action units 63. The rotation of the rotary unit 61 is controlled by a rotary driver such as a servo motor capable of detecting and controlling a rotary angle or a torque.

The three power transmission mechanisms 62 are mechanisms that transmit the rotation of the rotary unit 61 to the three alignment action units 63. In the first embodiment, each of the power transmission mechanisms 62 is a link mechanism. The three power transmission mechanisms 62 are pivotably supported at three different positions P11, P12, and P13 at the rotary unit 61 shifted from the first rotary axis 61c. In the first embodiment, the positions P11 to P13 are separated from the first rotary axis 61c by the same distance and arranged at regular intervals (an angular width of 120°) around the first rotary axis 61c. The three alignment action units 63 operate in response to transmission of the rotation of the rotary unit 61 through corresponding ones of the three power transmission mechanisms 62, thereby acting on a bonding target to adjust the position of the bonding target.

Each of the three power transmission mechanisms 62 includes a first arm 621, a second arm 622, a shaft 62C, and a third arm 623. The first arm 621 includes a first end 621a pivotably supported at a corresponding one of the three different positions P11 to P13, and a second end 621b located on the opposite side of the first end 621a. The second arm 622 includes a second rotary axis 622c and is pivotably supported on the second end 621b of the first arm 621 at a position different from the second rotary axis 622c. In the first embodiment, the second arm 622 includes a first end 622a and a second end 622b. The first end 622a is pivotably supported on the second end 621b of the first arm 621, and the second rotary axis 622c is provided at the second end 622b.

The respective second rotary axes 622c of the three power transmission mechanisms 62 are arranged at three positions P21, P22, and P23 separated from the rotary unit 61. The positions P21 to P23 are arranged in corresponding three different directions centered on the first rotary axis 61c. In the first embodiment, the positions P21 to P23 are arranged at regular intervals (an angular width of 120°) around the first rotary axis 61c along a predetermined circumference centered on the first rotary axis 61c.

The shaft 62C is connected to the second arm 622 with a center line of the shaft 62C aligned with the second rotary axis 622c. Further, the shaft 62C is pivotably supported on a subject to which the alignment mechanism 6 is attached (in the first embodiment, the second base 21B of the chamber mechanism 2 (see FIG. 2B). By doing so, the shaft 62C rotates around the second rotary axis 622c in interlocking relationship with the second arm 622 to function as a pivot for the motion of the power transmission mechanism 62.

In the first embodiment, the shaft 62C is connected to the second end 622b of the second arm 622. More specifically, the shaft 62C includes a first end 62Ca connected to the second end 622b of the second arm 622, and a second end 62Cb located on the opposite side of the first end 62Ca. The third arm 623 is connected to the second end 62Cb of the shaft 62C. In the first embodiment, the third arm 623 includes a first end 623a and a second end 623b. The first end 623a is connected to the second end 62Cb of the shaft 62C. More specifically, the third arm 623 extends from the second end 62Cb of the shaft 62C toward the same direction as the second arm 622 extends from the first end 62Ca of the shaft 62C. Namely, the third arm 623 is parallel to the second arm 622 and faces the second arm 622. Further, in the first embodiment, the third arm 623 extends to an intermediate position between the first end 622a and the second end 622b of the second arm 622 in a plan view. The direction in which the third arm 623 extends and the position of the tip (second end 623b) of the third arm 623 can be changed, if appropriate.

The three alignment action units 63 are provided at the respective tips (second ends 623b) of the third arms 623 of corresponding ones of the three power transmission mechanisms 62. Thus, in the first embodiment, the three alignment action units 63 are connected to the respective second arms 622 of corresponding ones of the three power transmission mechanisms 62 through the third arms 623 and the shafts 62C. For example, a roller pivotably supported on the second end 623b of the third arm 623 is used as each of the alignment action units 63.

According to the foregoing alignment mechanism 6, the three second arms 622 can move pivotably in synchronization with each other in response to the rotation of the rotary unit 61 (a direction of the rotation of the rotary unit 61 is indicated by a blank arrow in each of FIGS. 3A and 3B). The synchronized pivotal moves of the second arms 622 are transmitted through corresponding ones of the shafts 62C and third arms 623 to the three alignment action units 63. This allows the three alignment action units 63 to move inwardly in synchronization with each other (in FIG. 3A, directions of moves of the alignment action units 63 are indicated by blank arrows). By doing so, an alignment target (bonding target) is caught from the three directions by the three alignment action units 63 to adjust the position of the alignment target. As a result, it becomes possible to guide the alignment target to a predetermined position.

More specifically, the predetermined position is a destination position where the alignment target has been brought to a state of being caught under pressure uniformly from the three directions through adjustment process by the alignment mechanism 6. The alignment mechanism 6 makes the position adjustment through the following torque detection, for example. A torque generated at the rotary unit 61 when the alignment target is caught from the three directions is detected. The alignment target is caught under pressure uniformly from the three directions when the alignment target reaches the predetermined position, so that a torque generated at the rotary unit 61 increases. If the generated torque exceeds a predetermined value, the alignment target is determined to have reached the predetermined position. Then, the position adjustment is finished.

According to the foregoing alignment mechanism 6, even if a rattle occurs at a connection position (pivotably supported position), etc. of the alignment mechanism 6, this rattle can be controlled using reactive force from the alignment target generated by catching the alignment target under pressure from the three directions with an increased torque. As a result, even with the simple configuration of the foregoing alignment mechanism 6, a high degree of accuracy is achieved in the positioning of the alignment target.

In terms of achieving position adjustment with a high degree of accuracy, a disc-shaped object such as a wafer is suitable as the alignment target. Meanwhile, a shape applicable as the shape of the alignment target can be selected appropriately (for example, a polygonal shape or an oval shape) in response to a degree of accuracy in the position adjustment required during alignment.

In the first embodiment, the foregoing alignment mechanism 6 is arranged at the chamber mechanism 2 as follows. The rotary unit 61 is arranged on the opposite side of the second chuck unit 1B with respect to the second base 21B, and the three alignment action units 63 are arranged around the suction surface 11b of the second chuck unit 1B (see FIG. 1). The respective shafts 62C of the three power transmission mechanisms 62 are pivotably supported on the second base 21B while penetrating the second base 21B. Thus, it becomes possible to transmit the rotation of the rotary unit 61 to the three alignment action units 63 located on the opposite side of the rotary unit 61 with respect to the second base 21B. By doing so, a bonding target on the suction surface 11b is caught from the three directions by the three alignment action units 63. As a result, it becomes possible to adjust the position of the bonding target.

The alignment mechanism 6 is further applied to adjustment of the position of a bonding target when the bonding target is sucked on the suction surface 11a of the first chuck unit 1A. More specifically, each of the three alignment action units 63 includes a first abutting part 631 and a second abutting part 632 (see FIG. 1). The first abutting part 631 is to abut on the edge of a bonding target when the position of this bonding target to be sucked on the suction surface 11a of the first chuck unit 1A is adjusted. The second abutting part 632 is to abut on the edge of a bonding target when the position of this bonding target to be sucked on the suction surface 11b of the second chuck unit 1B is adjusted.

The second abutting part 632 is always arranged around the suction surface 11b of the second chuck unit 1B at the same height position as the suction surface 11b. The first abutting part 631 is arranged closer to the first base 21A than the second abutting part 632. In the first embodiment, the first abutting part 631 projects inwardly further than the second abutting part 632.

To adjust the position of a bonding target on the suction surface 11a of the first chuck unit 1A, the first base 21A and the second base 21B get closer to each other to place the first chuck unit 1A at a predetermined position at which the suction surface 11a of the first chuck unit 1A is placed at the same height position as the first abutting part 631.

In each of the alignment action units 63, the first abutting part 631 projects inwardly further than the second abutting part 632. By doing so, when a bonding target is sucked on the suction surface 11b and thereafter a different bonding target is to be sucked on the suction surface 11a, the position of the bonding target on the suction surface 11a can be adjusted using the first abutting part 631 while contact between the bonding target on the suction surface 11b and the second abutting part 632 is avoided.

The foregoing alignment mechanism 6 may also be arranged at the chamber mechanism 2 as follows. The rotary unit 61 is arranged on the opposite side of the first chuck unit 1A with respect to the first base 21A, and the three alignment action units 63 are arranged around the suction surface 11a of the first chuck unit 1A. The respective shafts 62C of the three power transmission mechanisms 62 are pivotably supported on the first base 21A while penetrating the first base 21A. By doing so, it becomes possible to transmit the rotation of the rotary unit 61 to the three alignment action units 63 located on the opposite side of the rotary unit 61 with respect to the first base 21A.

In this case, in each of the alignment action units 63, the second abutting part 632 preferably projects inwardly further than the first abutting part 631. By doing so, when a bonding target is sucked on the suction surface 11a and thereafter a different bonding target is to be sucked on the suction surface 11b, the position of the bonding target on the suction surface 11b can be adjusted using the second abutting part 632 while contact between the bonding target on the suction surface 11a and the first abutting part 631 is avoided.

[1-2] Motion of Bonder

FIGS. 4A to 7 show motions in order performed for bonding two bonding targets to each other in the foregoing bonder.

First, in the chamber mechanism 2, the first base 21A and the second base 21B are separated from each other to open the chamber 2a, and the second base 21B is arranged below the first base 21A. By doing so, the second chuck unit 1B is arranged below the first chuck unit 1A with the suction surface 11b of the second chuck unit 1B pointed upwardly (see FIG. 4A). Then, the gas pressure in the enclosed space 33B in the second floating mechanism 3B is reduced until the interior of the enclosed space 33B is placed in a vacuum state. This produces the gas pressure difference from outside air, so that the second chuck unit 1B is given holding power of attracting the second chuck unit 1B toward the second base 21B.

Figure 4A:
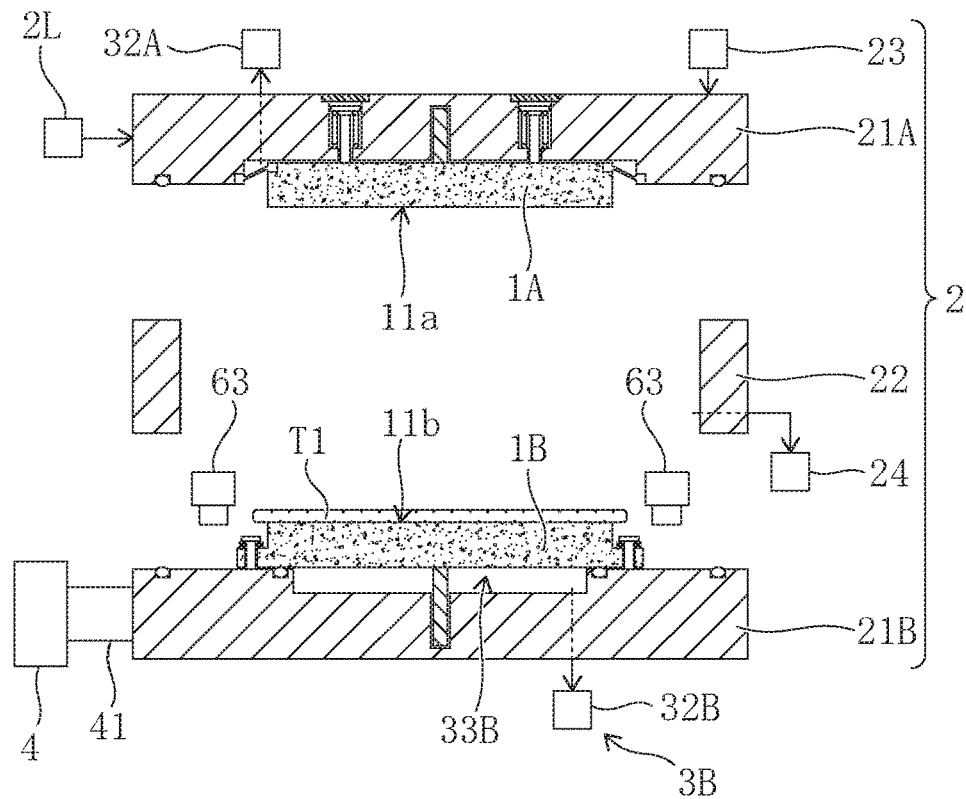
FIGS. 4A and 4B are conceptual views showing the motions of the bonder in order.
Figure 4B:
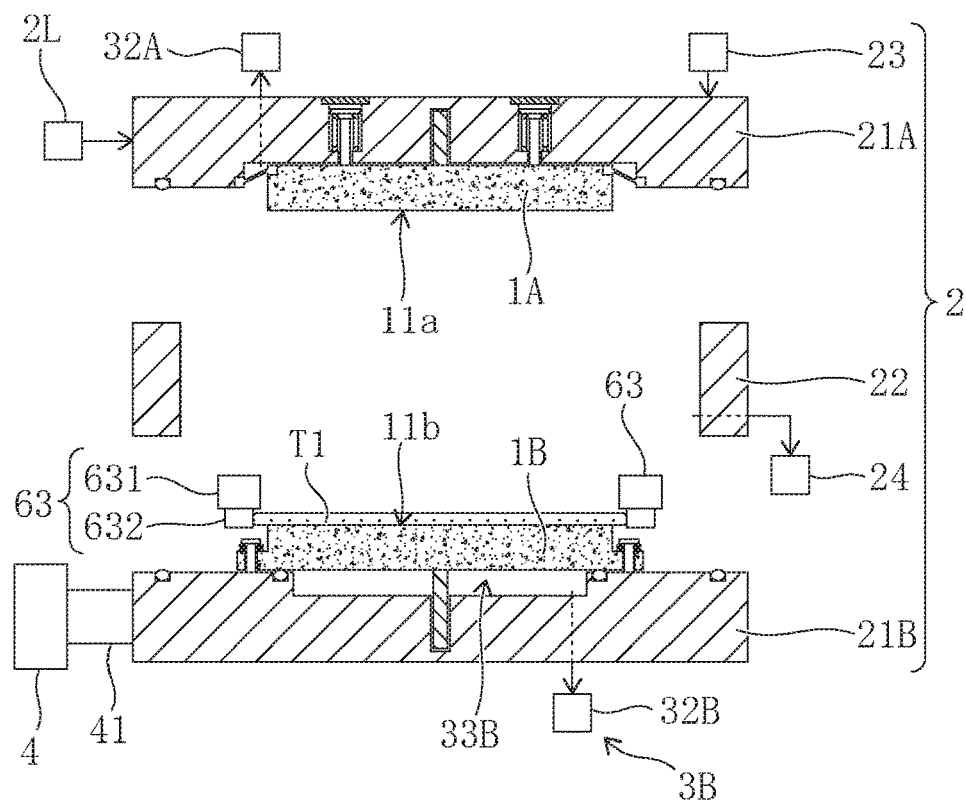

Next, a first bonding target T1 is placed on the suction surface 11b of the second chuck unit 1B (see FIG. 4A). The bonding target T1 is transported to and placed on the suction surface 11b using a transport device such as a transport arm (not shown in the drawings).

Then, the rotary unit 61 of the alignment mechanism 6 (see FIGS. 2A and 3A) is rotated clockwise in the plan view of FIG. 3A to move the three alignment action units 63 inwardly. Next, the respective second abutting parts 632 of the alignment action units 63 are brought to abutting contacts with the bonding target T1 from the three directions, thereby adjusting the position of the bonding target T1 (see FIGS. 3A and 4B). After the position of the bonding target T1 is adjusted, vacuum suction is applied at the second chuck unit 1B to suck the bonding target T1 on the suction surface 11b. In this way, the bonding target T1 is chucked on the second chuck unit 1B. The rotary unit 61 is thereafter rotated anticlockwise (namely, rotated reversely) in the plan view of FIG. 3B (same plan view as FIG. 3A) to move the three alignment action units 63 outwardly.

Next, the rotary axis 41 of the rotary mechanism 4 is rotated to turn over the chamber mechanism 2, thereby switching the upper and lower positions of the first base 21A and the second base 21B. By doing so, the first chuck unit 1A is arranged below the second chuck unit 1B with the suction surface 11a of the first chuck unit 1A pointed upwardly (see FIG. 5A). At this time, by the action of the holding power resulting from the gas pressure difference and biasing force applied from the second biasing mechanism 5B (mainly, disc spring 52B), the second chuck unit 1B is prevented from moving down unintentionally under its own weight. As a result, the second chuck unit 1B is maintained in a state of being attracted toward the second base 21B.

Then, the gas pressure in the enclosed space 33A in the first floating mechanism 3A is reduced until the interior of the enclosed space 33A is placed in a vacuum state. This produces the gas pressure difference from outside air, so that the first chuck unit 1A is given holding power of attracting the first chuck unit 1A toward the first base 21A. Then, a second bonding target T2 is placed on the suction surface 11a of the first chuck unit 1A (see FIG. 5A). The bonding target T2 is transported to and placed on the suction surface 11a using a transport device such as a transport arm (not shown in the drawings).

Figure 5A:
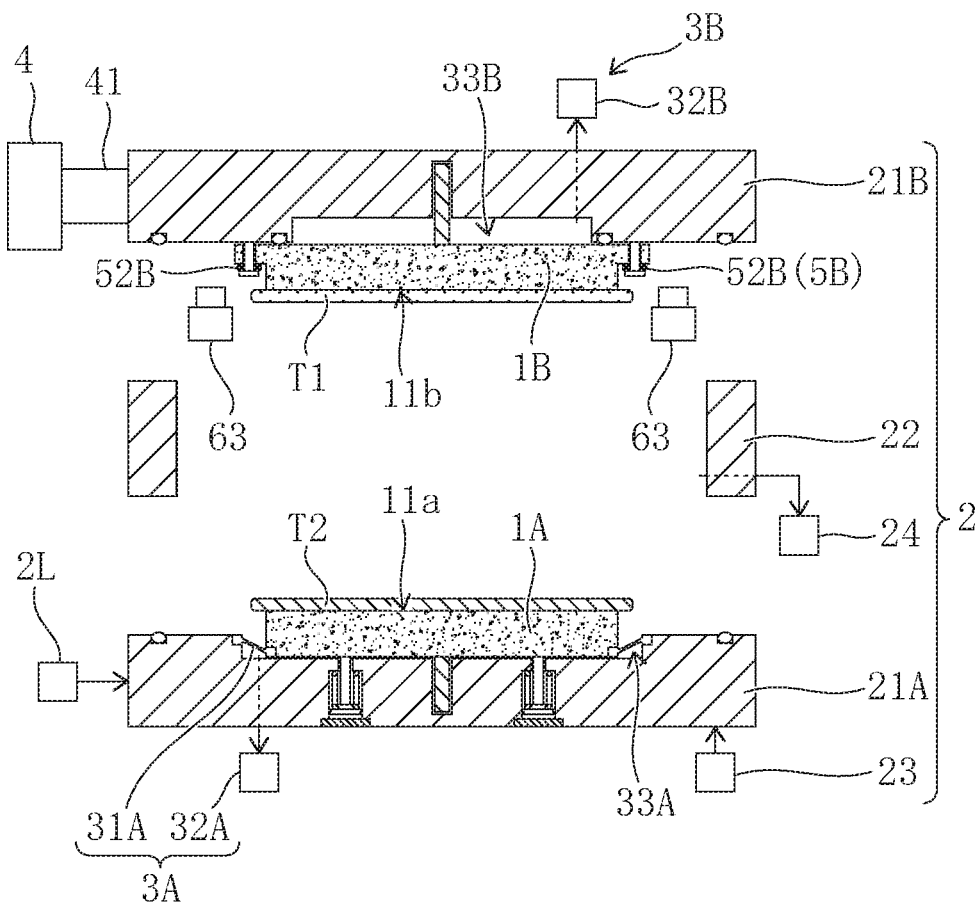
FIGS. 5A and 5B are conceptual views showing the motions of the bonder in order following the motion in FIG. 4B.
Figure 5B:
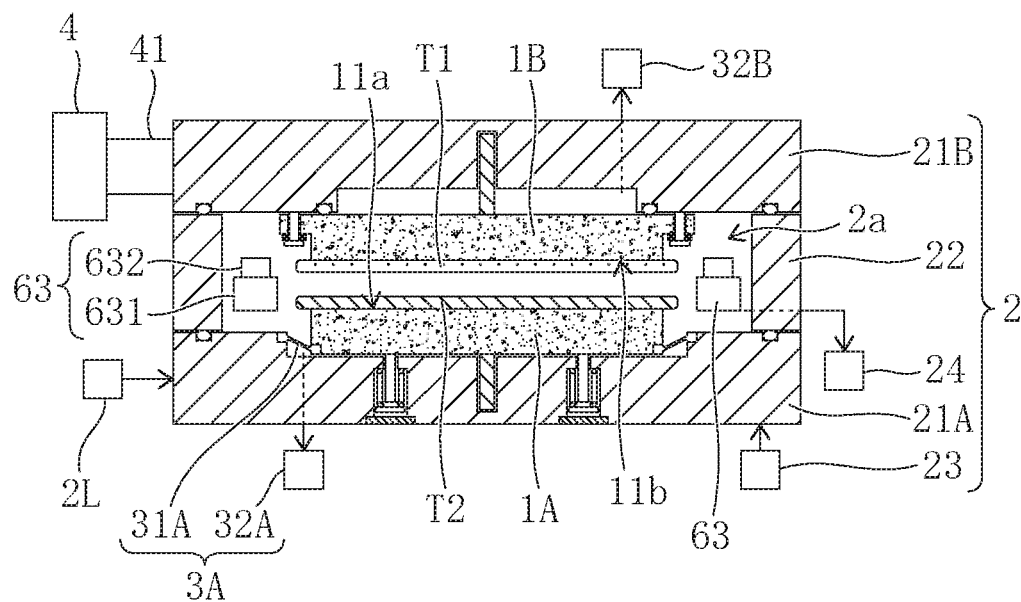
Figure 6A:
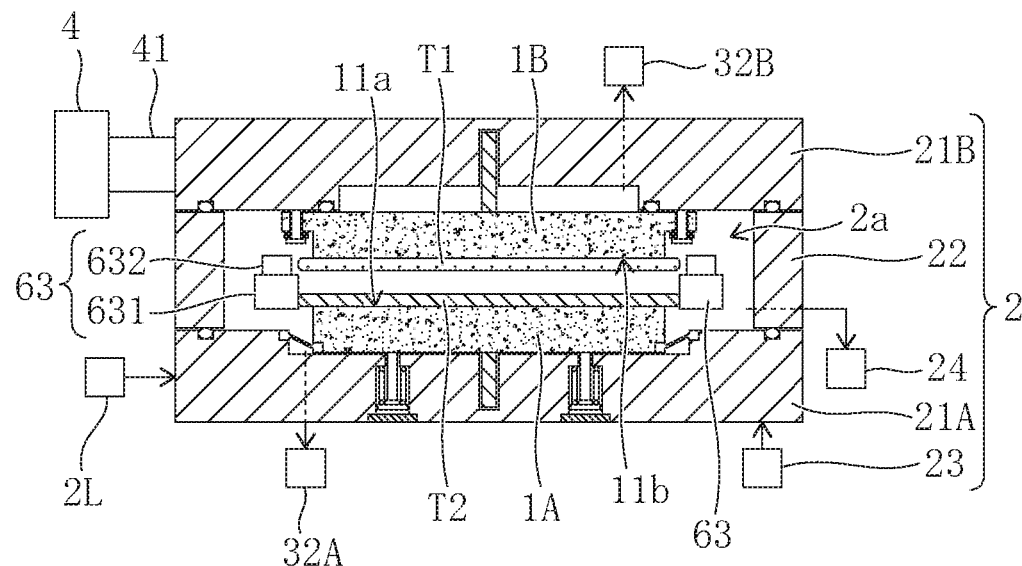
FIGS. 6A and 6B are conceptual views showing the motions of the bonder in order following the motion in FIG. 5B.
Figure 6B:
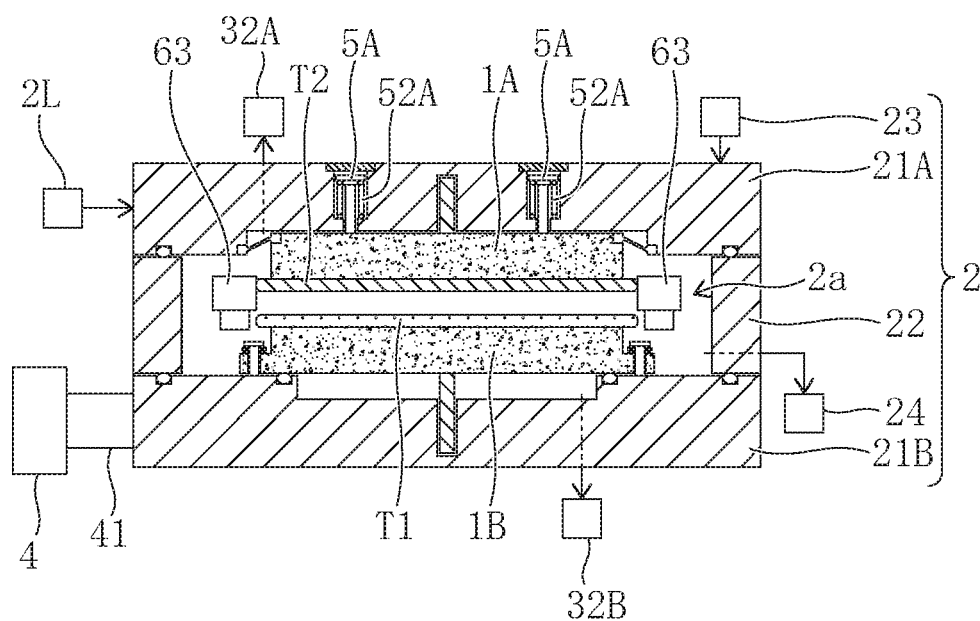
Figure 7:
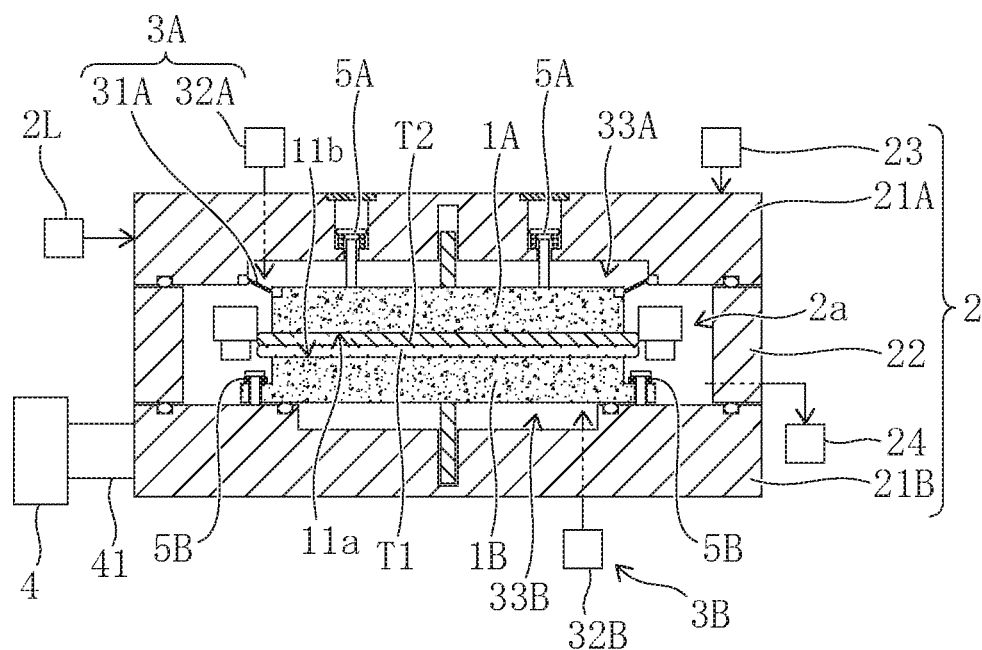
FIG. 7 is a conceptual view showing the motion of the bonder following the motion in FIG. 6B.

Next, in the chamber mechanism 2, the first base 21A and the second base 21B get closer to each other to form the enclosed chamber 2a (see FIG. 5B). In the first embodiment, when the chamber 2a is formed, the suction surface 11a of the first chuck unit 1A is placed at the same height position as the first abutting part 631. An alignment execution position may be prepared at which the suction surface 11a of the first chuck unit 1A is placed at the same height position as the first abutting part 631 before the formation of the chamber 2a. In this case, the first base 21A is to be stopped once at the alignment execution position before the formation of the chamber 2a.

Then, the rotary unit 61 of the alignment mechanism 6 (see FIGS. 2A and 3A) is rotated to move the three alignment action units 63 inwardly. Next, the respective first abutting parts 631 of the alignment action units 63 are brought to abutting contacts with the bonding target T2 from the three directions, thereby adjusting the position of the bonding target T2 (see FIGS. 3A and 6A). In the first embodiment, the first abutting part 631 projects inwardly further than the second abutting part 632 in each of the alignment action units 63. This allows adjustment of the position of the bonding target T2 on the suction surface 11a using the first abutting part 631 while avoiding contact between the bonding target T1 on the suction surface 11b and the second abutting part 632.

After the position of the bonding target T2 is adjusted, vacuum suction is applied at the first chuck unit 1A to suck the bonding target T2 on the suction surface 11a. In this way, the bonding target T2 is chucked on the first chuck unit 1A. In the first embodiment, the torque generated at the rotary unit 61 is thereafter maintained at a predetermined value or more. Specifically, the bonding target T2 is maintained in a state of being caught under pressure from the three directions by the three alignment action units 63 (first abutting parts 631).

Next, the rotary axis 41 of the rotary mechanism 4 is rotated to turn over the chamber mechanism 2 again, thereby returning the first base 21A and the second base 21B to their original upper and lower positions. By doing so, the first chuck unit 1A is arranged above the second chuck unit 1B (see FIG. 6B). At this time, by the action of the holding power resulting from the gas pressure difference and biasing force applied from the first biasing mechanism 5A (mainly, compression spring 52A), the first chuck unit 1A is prevented from moving down unintentionally under its own weight. As a result, the first chuck unit 1A is maintained in a state of being attracted toward the first base 21A. The bonding target T2 is maintained in a state of being caught under pressure from the three directions continuously from the time of the position adjustment.

Then, the gas pressure in the chamber 2a is reduced until the interior of the chamber 2a is placed in a vacuum state. This reduces the upward holding power having acted on the first chuck unit 1A as a result of the gas pressure difference between the gas pressure in the enclosed space 33A and the gas pressure in the chamber 2a. Even on the occurrence of such reduction in the holding power, downward move of the first chuck unit 1A under its own weight is still prevented by the first biasing mechanism 5A. Likewise, reducing the gas pressure in the chamber 2a reduces the power of vacuum-sucking the bonding target T2 on the suction surface 11a. Even on the occurrence of such reduction in the vacuum suction power, separation of the bonding target T2 under its own weight from the suction surface 11a is still prevented by catching the bonding target T2 under pressure from the three directions using the alignment mechanism 6. Namely, in the first embodiment, the alignment mechanism 6 functions as a holding mechanism that holds the bonding target T2. The bonding target T2 may be held by a holding mechanism provided separately from the alignment mechanism 6.

Next, in the first floating mechanism 3A, the gas pressure in the enclosed space 33A (internal pressure) is increased. At this time, the gas pressure in the enclosed space 33A (internal pressure) is regulated so as to allow the first chuck unit 1A to move down against the biasing force of the first biasing mechanism 5A. In this way, the first chuck unit 1A is floated from the first base 21A (see FIG. 7).

In parallel with this floating, in the second floating mechanism 3B, the gas pressure in the enclosed space 33B (internal pressure) is increased. At this time, the gas pressure in the enclosed space 33B (internal pressure) is regulated so as to allow the second chuck unit 1B to move up against the biasing force of the second biasing mechanism 5B. In this way, the second chuck unit 1B is floated from the second base 21B (see FIG. 7).

By floating the first chuck unit 1A and the second chuck unit 1B in the foregoing ways, the bonding targets T2 and T1 chucked on the suction surfaces 11a are 11b respectively are superimposed on each other. Next, the gas pressure in each of the enclosed space 33A and the enclosed space 33B (internal pressure) is increased further to press the bonding targets T1 and T2 against each other. By doing so, the two bonding targets T1 and T2 are caught under pressure by the first chuck unit 1A and the second chuck unit 1B and bonded on each other accordingly.

According to the bonder of the first embodiment, the gas pressures are applied to the respective back surfaces 12a and 12b of the first chuck unit 1A and the second chuck unit 1B, thereby encouraging uniform application of pressure to the back surfaces 12a and 12b. This makes it unlikely that both the first chuck unit 1A and the second chuck unit 1B will be subjected to deformation such as distortion. Thus, even when the bonding targets T1 and T2 are caught under pressure at the time of bonding, deformation is unlikely to occur at both the suction surfaces 11a and 11b. As a result, even at the time of bonding, it becomes possible to maintain a high degree of smoothness on each of the suction surfaces 11a and 11b.

In terms of maintaining a high degree of smoothness on each of the suction surfaces 11a and 11b, it is preferable that the gas pressures be applied to the back surfaces 12a and 12b of the first chuck unit 1A and the second chuck unit 1B respectively substantially equal to each other by making regulation at the time of bonding so as to place the interior of the enclosed space 33A and that of the enclosed space 33B in substantially equal gas pressure (internal pressure). The reason for this is that, by achieving a balance between the gas pressure applied from above and the gas pressure applied from below at the time of bonding, both the first chuck unit 1A and the second chuck unit 1B are maintained in floating states. More specifically, unnecessary pressure other than the gas pressure is unlikely to be applied to the back surfaces 12a and 12b at the time of bonding, thereby encouraging a high degree of smoothness on each of the two suction surfaces 11a and 11b.

Maintaining a high degree of smoothness on each of the suction surfaces 11a and 11b at the time of bonding allows pressure to be applied uniformly to the bonding targets T1 and T2. As a result, failure such as defective pressure bonding is unlikely to occur at a bonded item composed of the two bonding targets T1 and T2.

[2] Second Embodiment

In the foregoing bonder, the first biasing mechanism 5A may be configured to generate biasing force using gas pressure.

Figure 8A:
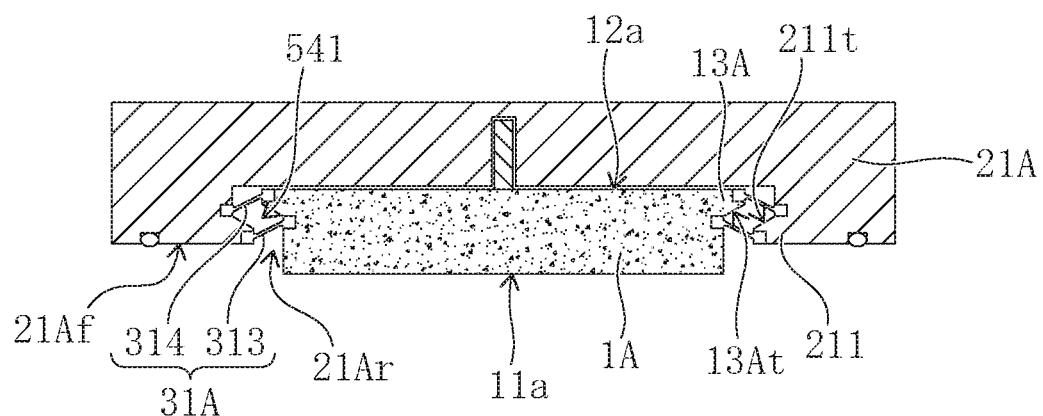
FIGS. 8A and 8B are sectional views showing two states in a first example about a first biasing mechanism of a bonder according to a second embodiment.
Figure 8B:
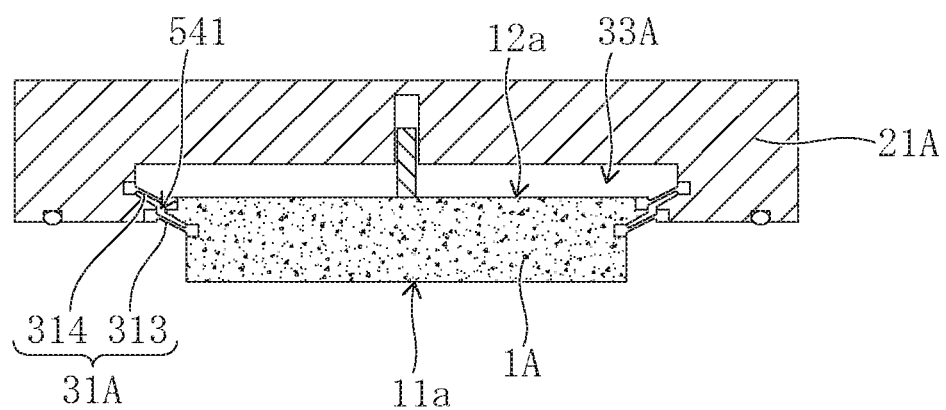

FIGS. 8A and 8B are sectional views showing two states in a first example about the first biasing mechanism 5A according to a second embodiment. In the first example, the support 31A of the first floating mechanism 3A is composed of two diaphragms 313 and 314. More specifically, the first chuck unit 1A has a peripheral side surface where a flange 13A is formed to extend on the same plane as the back surface 12a. The flange 13A includes a tilted surface 13At on the opposite side of the back surface 12a. The flange 13A becomes smaller in thickness at a position closer to the outer edge of the flange 13A. A flange 211 is further formed at the opening edge of the recess 21Ar. The flange 211 includes a tilted surface 211t substantially parallel to the tilted surface 13At. The tilted surfaces 13At and 211t are formed so as not to inhibit the motions of the diaphragms 313 and 314 responsive to the upward and downward moves of the first chuck unit 1A. As long as the motions of the diaphragms 313 and 314 are not inhibited, at least one of the tilted surfaces 13At and 211t can be replaced by a horizontal surface.

The root position of the flange 13A on the tilted surface 13At and the tip of the flange 211 are connected with the diaphragm 313. The tip of the flange 13A and the root position of the flange 211 on the tilted surface 211t are connected with the diaphragm 314.

In the foregoing configuration, space 541 enclosed with the two diaphragms 313 and 314 is formed between the two tilted surfaces 13At and 211t. Gas pressure in the space 541 is maintained to be higher at least than the gas pressure in the enclosed space 33A, thereby forming the first biasing mechanism 5A.

More specifically, according to the foregoing configuration of the first biasing mechanism 5A, of inner surfaces (pressure-receiving surfaces) forming the space 541 and available for transmitting received pressure to the first chuck unit 1A, a surface that receives pressure having a vertically upward component (in the second embodiment, this surface corresponds to a surface of the diaphragm 314 facing the space 541 and the tilted surface 13At) occupies an area of an image projected on a virtual horizontal plane larger than an area of an image projected on the virtual horizontal plane about a surface that receives pressure having a vertically downward component (in the second embodiment, this surface corresponds to a surface of the diaphragm 313 facing the space 541). Thus, even if the gas pressure in the chamber 2a is reduced to reduce the gas pressure difference between this gas pressure and the gas pressure in the enclosed space 33A, vertically upward biasing force is still applied to the first chuck unit 1A.

In the first example, principles of generating vertically upward biasing force at the first chuck unit 1A can also be considered as follows. When the first chuck unit 1A is at the closest position to the first base 21A within the range of motion of the first chuck unit 1A, the volume of the space 541 becomes maximum (see FIG. 8A). As the first chuck unit 1A gets away from the first base 21A, the volume of the space 541 is reduced (see FIG. 8B). Thus, as a result of the motion of the first chuck unit 1A for getting away from the first base 21A, the gas pressure in the space 541 increases and force for returning to a state of low pressure is applied as biasing force to the first chuck unit 1A.

According to this first biasing mechanism 5A, it becomes unnecessary to apply the biasing force of the first biasing mechanism 5A to the back surface 12a of the first chuck unit 1A. This encourages more uniform application of pressure to the back surface 12a. This makes it less likely that deformation such as distortion will occur at the first chuck unit 1A. As a result, it becomes possible to maintain a higher degree of smoothness on the suction surface 11a of the first chuck unit 1A.

Figure 9A:
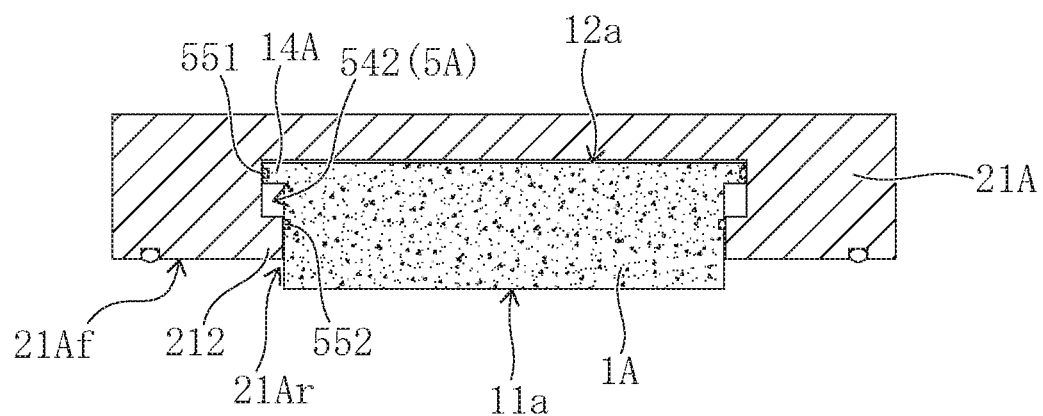
FIGS. 9A and 9B are sectional views showing two states in a second example about the first biasing mechanism of the bonder according to the second embodiment.
Figure 9B:
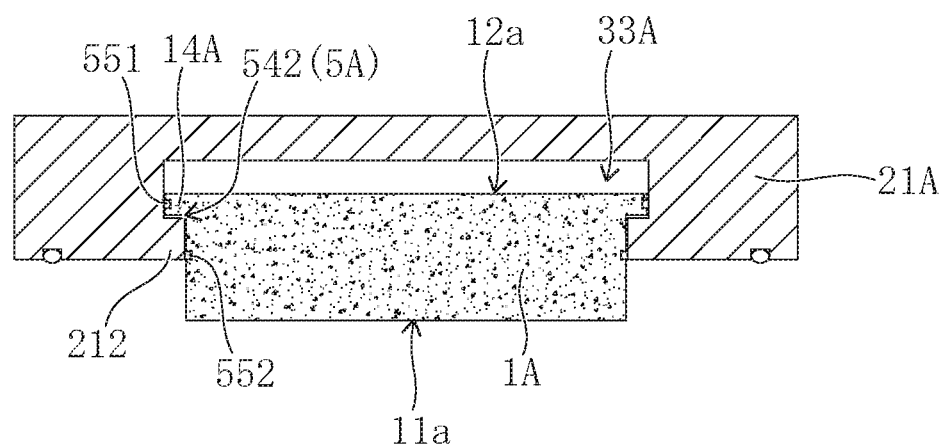

FIGS. 9A and 9B are sectional views showing two states in a second example about the first biasing mechanism 5A according to the second embodiment. In the second example, a flange 14A extending on the same plane as the back surface 12a is formed at the peripheral side surface of the first chuck unit 1A. A flange 212 is further formed at the opening edge of the recess 21Ar. The flange 14A has an edge surface in sliding contact with the inner side surface of the recess 21Ar. The flange 212 has an edge surface in sliding contact with the peripheral side surface of the first chuck unit 1A. Further, the edge surface of the flange 14A is provided with a sealing member 551 interposed between this edge surface and the inner side surface of the recess 21Ar. The peripheral side surface of the first chuck unit 1A is provided with a sealing member 552 interposed between this peripheral side surface and the edge surface of the flange 212. For example, O-rings are used as the sealing members 551 and 552.

In the foregoing configuration, space 542 enclosed with the two sealing members 551 and 552 is formed between the peripheral side surface of the first chuck unit 1A and the inner side surface of the recess 21Ar. Gas pressure in the space 542 is maintained to be higher at least than the gas pressure in the enclosed space 33A, thereby forming the first biasing mechanism 5A.

More specifically, according to the foregoing configuration of the first biasing mechanism 5A, of inner surfaces (pressure-receiving surfaces) forming the space 542 and available for transmitting received pressure to the first chuck unit 1A, a surface that receives pressure having a vertically upward component (in the second embodiment, this surface corresponds to a surface of the flange 14A facing the space 542) occupies an area of an image projected on a virtual horizontal plane larger than an area of an image projected on the virtual horizontal plane about a surface that receives pressure having a vertically downward component (there is no such a surface in the second embodiment). Thus, even if the gas pressure in the chamber 2a is reduced to reduce the gas pressure difference between this gas pressure and the gas pressure in the enclosed space 33A, vertically upward biasing force is still applied to the first chuck unit 1A.

In the second example, principles of generating vertically upward biasing force at the first chuck unit 1A can also be considered as follows. When the first chuck unit 1A is at the closest position to the first base 21A within the range of motion of the first chuck unit 1A, the volume of the space 542 becomes maximum (see FIG. 9A). As the first chuck unit 1A gets away from the first base 21A, the volume of the space 542 is reduced (see FIG. 9B). Thus, as a result of the motion of the first chuck unit 1A for getting away from the first base 21A, the gas pressure in the space 542 increases and force for returning to a state of low pressure is applied as biasing force to the first chuck unit 1A.

Like in the first example, according to this biasing mechanism 5A, it becomes unnecessary to apply the biasing force of the first biasing mechanism 5A to the back surface 12a of the first chuck unit 1A. This encourages more uniform application of pressure to the back surface 12a. This makes it less likely that deformation such as distortion will occur at the first chuck unit 1A. As a result, it becomes possible to maintain a higher degree of smoothness on the suction surface 11a of the first chuck unit 1A.

[3] Third Embodiment

Figure 10:
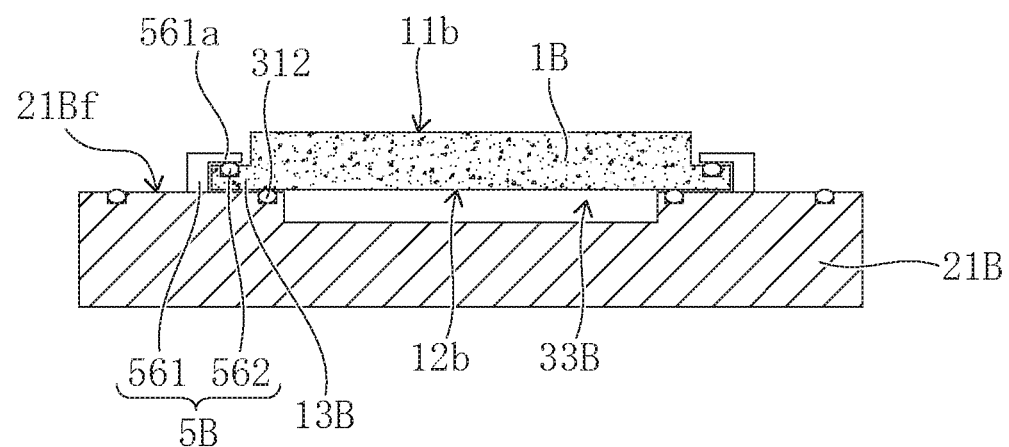
FIG. 10 is a sectional view showing a second biasing mechanism of a bonder according to a third embodiment.

FIG. 10 is a sectional view showing a different example of the second biasing mechanism 5B. As shown in FIG. 10, the second biasing mechanism 5B may be composed of an annular member 561 and an elastic member 562 instead of the pins 311 and the disc spring 52B. The annular member 561 is fixed to the facing surface 21Bf of the second base 21B. The annular member 561 is formed into a shape extending in an inverted L-shape from the facing surface 21Bf in a cross section to form an annular covering part 561a covering the flange 13B of the second chuck unit 1B. The elastic member 562 is an elastically deformable member and is interposed between the flange 13B and the covering part 561a. As an example, an elastically deformable sealing member (O-ring, for example) is used as the elastic member 562.

According to the foregoing configuration of the second biasing mechanism 5B, the second chuck unit 1B is biased toward the second base 21B by the elastic member 562. If a sealing member is applied to the elastic member 562, the elastic member 562 may take the place of the sealing member 312 to fulfill the function of the sealing member 312 (retention of the enclosed space 33B).

[4] Fourth Embodiment

Two bonding targets may be heated for improving adhesion at the time of bonding, and may be cooled after the bonding is finished. As an example, the first chuck unit 1A and the second chuck unit 1B include respective built-in heaters. By heating the bonding targets with these heaters, adhesives applied to the bonding targets are melted. After the bonding is finished, the first chuck unit 1A and the second chuck unit 1B themselves are cooled to solidify the adhesives. A bonder described in detail below as a fourth embodiment includes cooling mechanisms that cool the first chuck unit 1A and the second chuck unit 1B.

Figure 11:
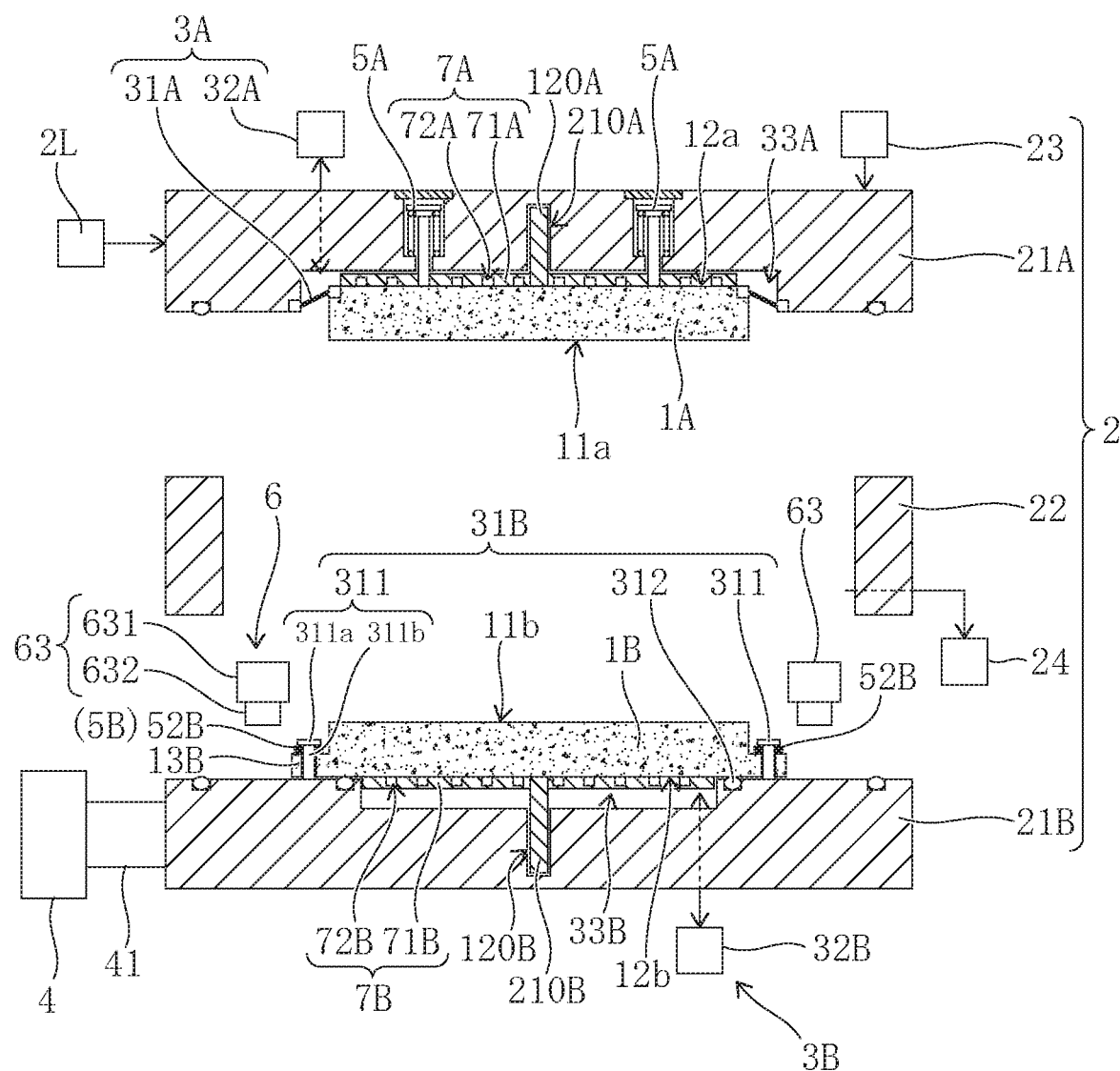
FIG. 11 is a conceptual view showing the configuration of a bonder according to a fourth embodiment.

FIG. 11 is a conceptual view showing the configuration of the bonder according to the fourth embodiment. As shown in FIG. 11, the bonder includes a first cooling mechanism 7A that cools the first chuck unit 1A, and a second cooling mechanism 7B that cools the second chuck unit 1B.

The first cooling mechanism 7A includes a cooling plate 71A arranged on the back surface 12a of the first chuck unit 1A. A pathway 72A for passage of a cooling medium is formed at a surface of the cooling plate 71A in tight contact with the back surface 12a. The pathway 72A is configured to avoid leakage of the cooling medium into the enclosed space 33A. The cooling medium can either be gas or liquid and can be selected appropriately so as to maintain the first chuck unit 1A at an optimum temperature.

The second cooling mechanism 7B includes a cooling plate 71B arranged on the back surface 12b of the second chuck unit 1B. A pathway 72B for passage of a cooling medium is formed at a surface of the cooling plate 71B in tight contact with the back surface 12b. The pathway 72B is configured to avoid leakage of the cooling medium into the enclosed space 33B. The cooling medium can either be gas or liquid and can be selected appropriately so as to maintain the second chuck unit 1B at an optimum temperature.

The first cooling mechanism 7A and the second cooling mechanism 7B can cool the first chuck unit 1A and the second chuck unit 1B respectively. Meanwhile, excessive cooling causes the risk of deformation of the suction surfaces 11a and 11b. Thus, during cooling, the temperatures of the first chuck unit 1A and the second chuck unit 1B are preferably managed appropriately.

[5] Fifth Embodiment

According to a fifth embodiment, the foregoing bonder may further include a notch alignment mechanism 8. The notch alignment mechanism 8 is used for making further position adjustment in the peripheral direction on a bonding target that is adjusted in position by the foregoing alignment mechanism 6. More specifically, the bonding target is given a notch for position adjustment, and the notch alignment mechanism 8 adjusts the position of the notch in the peripheral direction.

Figure 12A:
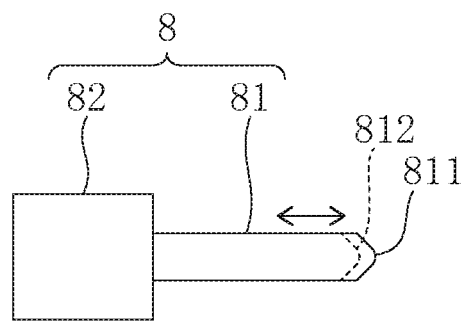
FIGS. 12A and 12B are a plan view and a side view respectively showing the configuration of a notch alignment mechanism of a bonder according to a fifth embodiment.
Figure 12B:
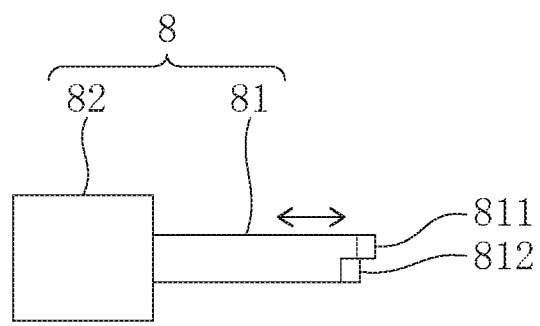

FIGS. 12A and 12B are a plan view and a side view respectively showing the configuration of the notch alignment mechanism 8. As shown in FIGS. 12A and 12B, the notch alignment mechanism 8 includes an arm part 81 extending in the horizontal direction, and a driving part 82 allowing the arm part 81 to move back and forth in the direction in which the arm part 81 extends. The arm part 81 has a front end provided with a first apex 811 and a second apex 812 arranged stepwise and each sharp-pointed frontward (see FIG. 12B). The first apex 811 is to be inserted into a notch formed at the edge of a bonding target when the position of this bonding target to be sucked on the suction surface 11a of the first chuck unit 1A is adjusted (see FIG. 14C). The second apex 812 is to be inserted into a notch formed at the edge of a bonding target when the position of this bonding target to be sucked on the suction surface 11b of the second chuck unit 1B is adjusted (see FIG. 13C).

The first apex 811 projects frontward further than the second apex 812. By doing so, when a bonding target is sucked on the suction surface 11b and thereafter a different bonding target is to be sucked on the suction surface 11a, the position of the bonding target on the suction surface 11a can be adjusted using the first apex 811 while contact between the bonding target on the suction surface 11b and the second apex 812 is avoided. This will be described in more detail below.

Figure 13A:
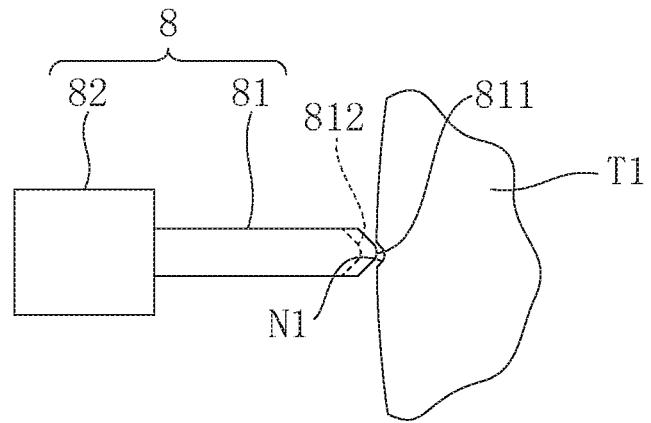
FIG. 13A is a plan view showing a state before a second apex is inserted into a notch.
Figure 13B:
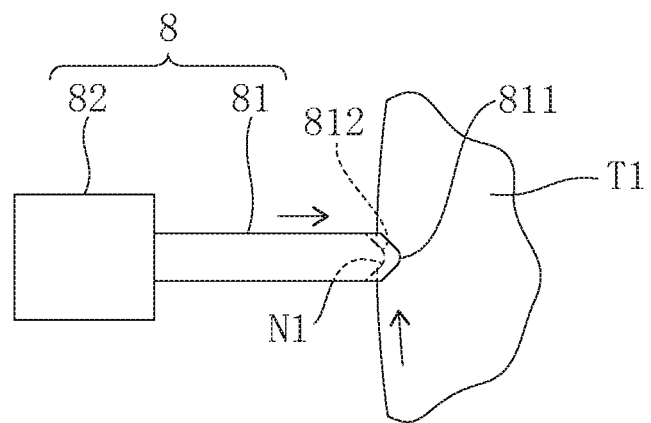
FIGS. 13B and 13C are a plan view and a side view respectively showing a state when the second apex is inserted into the notch.
Figure 13C:
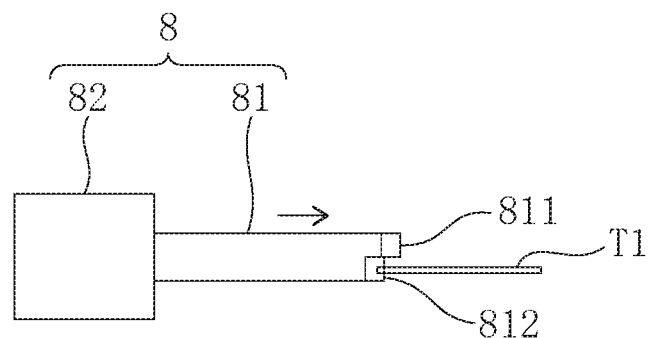

First, during adjustment of the position of the bonding target T1 on the suction surface 11b using the alignment mechanism 6 (see FIG. 4B), the arm part 81 of the notch alignment mechanism 8 is moved forward to insert the second apex 812 into a notch N1 formed at the edge of the bonding target T1 (see FIGS. 13A to 13C). FIG. 13A is a plan view showing a state before the second apex 812 is inserted into the notch N1. FIGS. 13B and 13C are a plan view and a side view respectively showing a state when the second apex 812 is inserted into the notch N1.

By inserting the second apex 812 into the notch N1 in this way, compelling force acting in the peripheral direction is applied to the bonding target T1 to forcibly rotate the bonding target T1 until the notch N1 is aligned with the second apex 812. After the position of the bonding target T1 is adjusted using the alignment mechanism 6 and the notch alignment mechanism 8, vacuum suction is applied at the second chuck unit 1B.

Figure 14A:
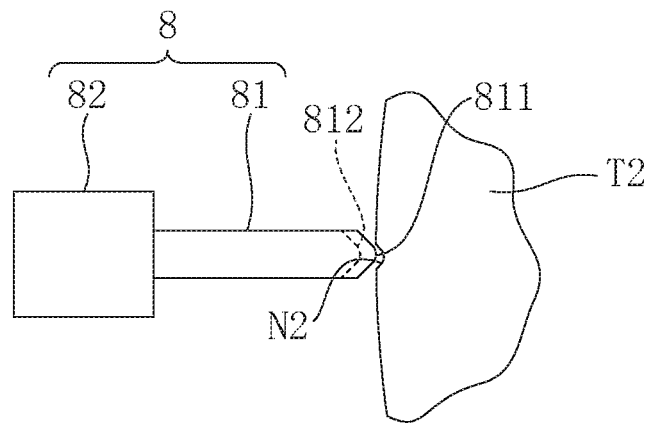
FIG. 14A is a plan view showing a state before a first apex is inserted into a notch.
Figure 14B:
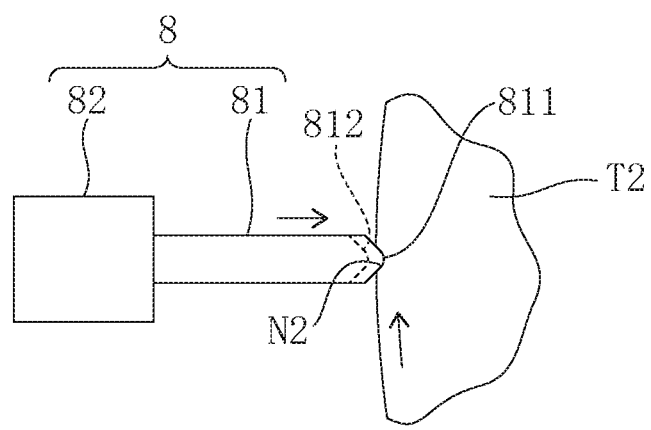
FIGS. 14B and 14C are a plan view and a side view respectively showing a state when the first apex is inserted into the notch.
Figure 14C:
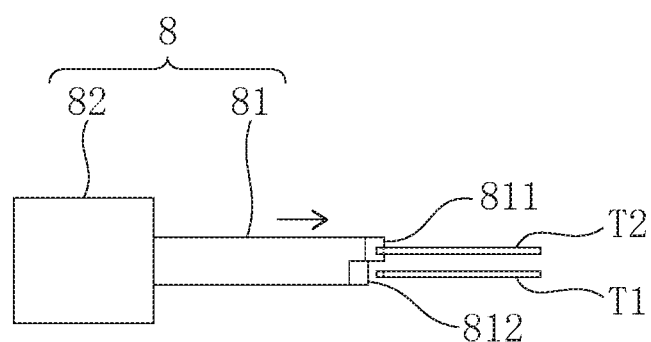

Next, during adjustment of the position of the bonding target T2 on the suction surface 11a using the alignment mechanism 6 (see FIG. 6A), the arm part 81 of the notch alignment mechanism 8 is moved forward to insert the first apex 811 into a notch N2 formed at the edge of the bonding target T2 (see FIGS. 14A to 14C). FIG. 14A is a plan view showing a state before the first apex 811 is inserted into the notch N2. FIGS. 14B and 14C are a plan view and a side view respectively showing a state when the first apex 811 is inserted into the notch N2.

By inserting the first apex 811 into the notch N2 in this way, compelling force acting in the peripheral direction is applied to the bonding target T2 to forcibly rotate the bonding target T2 until the notch N2 is aligned with the first apex 811. After the position of the bonding target T2 is adjusted using the alignment mechanism 6 and the notch alignment mechanism 8, vacuum suction is applied at the first chuck unit 1A.

[6] Other Embodiments

Chuck of a bonding target on the first chuck unit 1A or the second chuck unit 1B is not limited to the foregoing vacuum chuck. Electrostatic chuck may be used. Alternatively, electrostatic chuck and vacuum chuck may be used in combination.

The various configurations of the first floating mechanism 3A described above are further applicable to the second floating mechanism 3B. The various configurations of the second floating mechanism 3B described above are further applicable to the first floating mechanism 3A. Further, the configuration of the bonder may be such that the floating mechanism is applied to only one of the first chuck unit 1A and the second chuck unit 1B. In this case, one of the chuck units with the floating mechanism corresponds to a first chuck unit described in claims.

The applicability of the foregoing alignment mechanism 6 is not limited to a bonder but the alignment mechanism 6 is applicable to various types of chuck devices. Further, the applicability of the alignment mechanism 6 is not limited to a chuck device but the alignment mechanism 6 is applicable to various types of position adjustments. The number of the power transmission mechanisms 62 of the alignment mechanism 6 is not limited to three but it may be two, or four or more.

The above explanations of the embodiments are nothing more than illustrative in any respect, nor should be thought of as restrictive. The scope of the present invention is indicated by claims rather than the above embodiments. Further, it is intended that all changes that are equivalent to a claim in the sense and realm of the doctrine of equivalence be included within the scope of the present invention.

REFERENCE SIGNS LIST

1A First chuck unit
2B Second chuck unit
2 Chamber mechanism
2a Chamber
2L Locking mechanism
3A First floating mechanism
3B Second floating mechanism
4 Rotary mechanism
5A First biasing mechanism
5B Second biasing mechanism
6 Alignment mechanism
7A First cooling mechanism
7B Second cooling mechanism
8 Notch alignment mechanism
11a, 11b Suction surface
12a, 12b Back surface
12c Peripheral region
13A, 13B Flange
13At Tilted surface
14A Flange
21A First base
21B Second base
21Bc Annular region
21Af, 21Bf Facing surface
21Ar, 21Br Recess
22 Side wall
23 Driving part
24 Exhaust part
31A, 31B Support
32A First gas pressure regulator
32B Second gas pressure regulator
33A, 33B Enclosed space
41 Rotary axis
51A Housing chamber
52A Compression spring 52B Disc spring
53A Pin
53Aa Head
53Ab Shaft
61 Rotary unit
61c First rotary axis
62 Power transmission mechanism
62C Shaft
62Ca First end
62Cb Second end
63 Alignment action unit
71A, 71B Cooling plate
72A, 72B Pathway
81 Arm part
82 Driving part
120A, 120B Shaft
210A, 210B Receiver
211 Flange
211t Tilted surface
212 Flange
311 Pin
311a Head
311b Shaft
312 Sealing member
313, 314 Diaphragm
541, 542 Space
551, 552 Sealing member
561 Annular member
561a Covering part
562 Elastic member
621 First arm
622 Second arm
622c Second rotary axis
623 Third arm
621a, 622a, 623a First end
621b, 622b, 623b Second end
631 First abutting part
632 Second abutting part
811 First apex
812 Second apex
P11, P12, P13 Position
P21, P22, P23 Position
T1, T2 Bonding target
N1, N2 Notch

The invention claimed is:

1. A bonder comprising:
a first chuck unit and a second chuck unit as chuck units in a pair including respective suction surfaces for suction of bonding targets, the first chuck unit and the second chuck unit being arranged with the respective suction surfaces facing each other;
a first base and a second base that support the first chuck unit and the second chuck unit respectively; and
a first floating mechanism that is configured to apply gas pressure to the back surface of the first chuck unit to float the first chuck unit from the first base, thereby moving the suction surface of the first chuck unit toward the suction surface of the second chuck unit; wherein:
the first chuck unit has a shaft that projects from the back surface of the first chunk unit,
the first base has a recessed receiver into which the shaft of the first chuck unit is slidably inserted to prevent the center position of the first chuck unit from deviating from a predetermined position while the first chuck unit is floated, and
play for permitting slight tilt of the suction surface of the first chuck unit is provided between the shaft of the first chuck unit and the receiver of the first base.

2. The bonder according to claim 1, further comprising:
a second floating mechanism that is configured to apply gas pressure to the back surface of the second chuck unit to float the second chuck unit from the second base, thereby moving the suction surface of the second chuck unit toward the suction surface of the first chuck unit, wherein:
the second chuck unit has a shaft that projects from the back surface of the second chuck unit,
the second base has a recessed receiver into which the shaft of the second chuck unit is slidably inserted to prevent the center position of the second chuck unit from deviating from a predetermined position while the second chuck unit is floated, and
play for permitting slight tilt of the suction surface of the second chuck unit is provided between the shaft of the second chuck and the receiver of the second base.

3. The bonder according to claim 2, wherein
the first floating mechanism and the second floating mechanism are configured to apply the gas pressures to the back surfaces of the first chuck unit and the second chuck unit respectively substantially equal to each other at the time of bonding of the bonding targets.

4. The bonder according to claim 1, further comprising:
a locking mechanism configured to maintain the positions of the first base and the second base relative to each other at the time of bonding of the bonding targets.

5. The bonder according to claim 1, further comprising:
a chamber mechanism comprising the first base and the second base and configured to form a chamber between the bases, the chamber housing the first chuck unit and the second chuck unit inside the chamber and being enclosed, wherein
the chamber mechanism further comprises:
a driving part that allows the first base to move relative to the second base in a direction perpendicular to the suction surface, and forms the chamber by making the first base and the second base get closer to each other; and
an exhaust part that reduces gas pressure in the chamber.

6. The bonder according to claim 5, further comprising:
a rotary mechanism including a rotary axis extending in a direction along the suction surfaces, and configured to switch the positions of the first base and the second base by turning over the chamber mechanism around the rotary axis.

* * * * *